United States Patent [19]
Johnson

[11] Patent Number: 5,159,213
[45] Date of Patent: Oct. 27, 1992

[54] LOGIC GATE CIRCUIT WITH LIMITED TRANSIENT BOUNCE IN POTENTIAL OF THE INTERNAL VOLTAGE SUPPLY LINES

[75] Inventor: Derrell Q. Johnson, Orem, Utah

[73] Assignee: North American Philips Corporation, New York, N.Y.

[21] Appl. No.: 534,773

[22] Filed: Jun. 7, 1990

[51] Int. Cl.$^5$ .................. H03K 19/08; H03K 17/16
[52] U.S. Cl. .................. 307/443; 307/315; 307/456; 307/549; 307/542
[58] Field of Search .............. 307/443, 542, 456, 458, 307/455, 362, 300, 315, 547, 228, 549

[56] References Cited

U.S. PATENT DOCUMENTS

| | | | |
|---|---|---|---|
| 3,980,901 | 9/1976 | Tokuda | 307/300 |
| 4,424,455 | 1/1984 | Neely | 307/442 |
| 4,426,590 | 1/1984 | Rischmuller | 307/315 |
| 4,504,928 | 3/1985 | Davies et al. | 307/228 |
| 4,521,699 | 6/1985 | Wilson | 307/456 |
| 4,616,144 | 10/1986 | Hideshima et al. | 307/300 |
| 4,698,519 | 10/1987 | Cini et al. | 307/300 |
| 4,704,548 | 11/1987 | Strong et al. | 307/458 |
| 4,705,968 | 11/1987 | Taki | 307/300 |
| 4,814,645 | 3/1989 | Kitora et al. | 307/458 |
| 4,886,985 | 12/1989 | Flohrs et al. | 307/300 |
| 4,893,032 | 1/1990 | Braden | 307/300 |
| 4,897,566 | 1/1990 | Kitora et al. | 307/443 |
| 4,945,396 | 7/1990 | Shigekane et al. | 307/315 |
| 4,970,620 | 11/1990 | Lehnhoff et al. | 307/300 |

Primary Examiner—Stanley D. Miller
Assistant Examiner—Toan Tran
Attorney, Agent, or Firm—Leroy Eason

[57] ABSTRACT

A logic gate circuit of TTL, ECL or other configuration, having an output stage including at least one transistor and a control transistor which switches the output stage to either a low or high conductive state in accordance with an input logic control signal supplied to the control transistor. In order to limit the transient change in potential of the internal voltage supply lines of the logic circuit relative to the external voltage supply to which they are connected, which occurs during logic state transitions, the base-emitter path of the output transistor is shunted by the collector-emitter path of a current bypass transistor the base of which is driven by the control transistor. The output transistor may be a composite equivalent transistor formed by a Darlington-connected pair of transistors, and the bypass transistor may itself be such a composite transistor. With increasing collector current of the output transistor an increasing proportion of the base drive current supplied thereto by the control transistor is diverted by the current bypass transistor, thereby limiting the maximum collector current of the output transistor and consequently limiting the aforesaid transient change or "bounce" in potential of the internal supply lines relative to the external voltage supply.

6 Claims, 2 Drawing Sheets

TTL GATE

ECL GATE

TTL GATE

ECL GATE

LOGIC GATE CIRCUIT WITH LIMITED TRANSIENT BOUNCE IN POTENTIAL OF THE INTERNAL VOLTAGE SUPPLY LINES

BACKGROUND OF THE INVENTION

1. Field of the Invention

The present invention relates to digital logic gate circuits which employ transistors as the active switching elements, and more particularly to such gate circuits wherein a change of logic state may cause transient variations of the potential of the internal voltage supply lines of the circuit relative to the external voltage supply to which the circuit is connected. Such variations are most troublesome in the low potential or ground line, being generally referred to as ground "bounce", and if excessive will result in erroneous logic signals at the load driven by the gate circuit.

2. Description of the Related Art

Various types of digital gate circuits are known in the art which employ transistors as the active switching elements for producing a logic "1" or "0" output, depending on the logic value of a control signal supplied to the circuit. One type of gate employs TTL logic, the output logic signal being produced at the juncture of a "pull-down" transistor and a "pull-up" transistor. Those are so-named because the former serves to bring the output signal down to the internal ground potential of the circuit and the latter brings the output signal up to a potential approaching that of the external voltage supply to which the circuit is connected. When positive logic is employed the ground potential corresponds to a logic "0" and the high potential to a logic "1". For simplicity of description that will be assumed herein, but it will be evident that negative logic could equally well be employed wherein the low potential would correspond to a logic "1" and the high potential to a logic "0".

A problem with TTL logic is that the pull-down transistor may be driven into saturation during turn-on, which limits its turn-off speed due to storage of minority carriers in the base zone. In Schottky logic families, to prevent saturation a Schottky barrier diode is connected between the base and collector of the transistor and serves to clamp the base current as saturation is approached.

Saturation is avoided in gate circuits which employ ECL logic, wherein the output stage is a single transistor which operates in the active region between saturation and cutoff to produce an output logic signal of a binary value dependent on whether the logic input control signal supplied to the circuit is high ("1") or low ("0").

Selection of the logic state to be established in the output stage in response to the logic input control signal is effected by a control transistor coupled to such stage and which renders it either more conductive or less conductive depending on the logic value of such control signal. In TTL logic the input control signal may be produced by an input circuit configured to provide a given logic function; e.g., AND, OR, NAND, etc, among a number of inputs thereto. In ECL logic the input circuit may comprise several transistors which receive respective logic signals at their bases and which have their emitters connected in common to a constant current source which also supplies current to the emitter of the control transistor of the gate circuit.

The basic features of a TTL logic gate are shown, for example, in FIG. 1 of U.S. Pat. No. 4,287,433, issued Sept. 1, 1981, as well as in FIG. 1 of U.S. Pat. No. 4,584,490, issued Apr. 22, 1986. The problem of transient ground bounce during high speed transitions between logic states of a TTL logic gate circuit is dealt with in U.S. Pat. No. 4,855,622, issued Aug. 8, 1989. This occurs because the transistors in the pull-up and pull-down stages may both be conductive for a brief interval during a logic state transition, and also because of transient currents produced in such stages due to the capacitance of the load driven by the logic gate. The resistance and inductance of the lines by which the gate circuit is connected to the external voltage supply and to the load are also contributing factors. Such patent teaches to limit ground bounce by providing a buffer circuit for the TTL gate which provides a controlled ramp output and includes means for limiting current between such output and the external ground.

A high speed form of TTL logic gate, which includes clamping diodes to keep the pull-down transistor out of saturation, is disclosed in U.S. Pat. No. 4,501,976, issued Feb. 26, 1985, and such circuit is substantially as shown in FIG. 1 herein. All transistors and diodes therein except pull-up transistor Q2 are of the Schottky clamped type. For purposes of illustration all the transistors are shown as NPN type bipolar transistors.

The pull-up transistor Q2 and pull-down transistor Q1 are connected in series between the internal voltage supply line 1 of the circuit and the internal ground line 2. Supply line 1 is coupled to the high terminal of an external voltage supply $V_{cc}$. Such coupling has inherent resistance and inductance which are represented by a resistor $R_v$ and inductor $L_v$ in series. The low or ground terminal of the external voltage supply $V_{cc}$ is coupled to the internal ground line 2. The inherent resistance and inductance of that coupling are represented by a resistor $R_g$ and inductor $L_g$ in series. The collector of transistor Q2 is coupled by a resistor 4 to supply line 1. The logic output signal of the circuit is produced at the junction 5 of transistors Q1 and Q2, which junction is coupled to an external load 7 across which such signal is produced as an output voltage $V_{OUT}$. The latter coupling also has inherent resistance and inductance, which are represented as a resistor $R_o$ in series with a conductor $L_o$.

The input logic control signal $V_{IN}$ supplied to the logic circuit is obtained from an input circuit (not shown) as described above, and is received at the base of a transistor Q3 which serves as the control transistor. The emitter of the control transistor Q3 is connected to the base of pull-down transistor Q1. The collector of control transistor Q3 is connected to supply line 1 by a resistor 9, and is further connected to the base of a transistor Q4 the emitter of which is connected to the base of pull-up transistor Q2. The collector of transistor Q4 is connected to the collector of transistor Q2, and the emitter of transistor Q4 is connected to internal ground line 3 by a resistor 11. Transistors Q2 and Q4 thereby form a Darlington pair, which provides a high current gain between the base of the first Darlington transistor Q4 and the emitter of the second Darlington transistor Q2. A diode 13 is connected between the base of transistor Q2 and the collecter of transistor Q3, and speeds turn-off of the Darlington pair when the input logic control signal $V_{IN}$ at the base of transistor Q3 switches from a "0" to a "1". The emitter of transistor Q3 is returned to internal ground line 2 by a resistor 14 in series with a diode 15 which speeds turn-off of transistor Q1 when the input logic signal $V_{IN}$ changes from a "1" to a "0".

In operation, if the input logic control signal $V_{in}$ is a "0" it will cause control transistor Q3 to turn off. The emitter thereof then drops towards the potential of internal ground line 2 and so causes pull-down transistor Q1 to turn off. The potential at junction point 5, which is at the collecter of transistor Q1, is thereby isolated from ground. Turn-off of transistor Q3 also causes its collector voltage to rise, thereby turning on transistor Q4 which in turn causes turn-on of its Darlington pair pull-up transistor Q2. The potential at the emitter of transistor Q2 thereby rises nearly to that of supply line 1 less the base-emitter voltages of transistors Q4 and Q2, resulting in a logic "1" output signal $V_{OUT}$ at load 7. When the input logic control signal $V_{IN}$ changes to a "1" it cause control transistor Q3 to turn on. Its emitter voltage therefore rises, turning on pull-down transistor Q1. At the same time, the collector voltage of transistor Q3 falls, turning off both of Darlington transistors Q2 and Q4. Junction point 5 is thereby isolated from voltage supply line 1, but is connected by transistor Q1 to the internal ground line 2. A logic "0" output signal $V_{OUT}$ is thereby produced at load 7.

A problem with this circuit is that during each switch-over between the "1" and "0" logic state there is a brief interval during which transistors Q1 and Q2 are both conductive. A large feed-through current then is drawn from voltage source $V_{cc}$ to its ground return in the path through inductor $L_v$ and resistor $R_v$, transistors Q2 and Q1, and resistor $R_g$ and inductor $L_g$. In addition, even after one of transistors Q1 and Q2 turns off, the resistor $R_O$ and inductor $L_O$ will maintain the current then existing therein for a transient interval and so delay a change in the output logic signal $V_O$. A further factor is that if load 7 has significant capacitance there will be large charge and discharge currents through transistors Q1 and Q2. If the logic circuit is designed for switching logic signals to a load requiring significant current, such transient capacitive currents can reach several hundred milliamperes. The transient voltage drop produced by such currents in the various resistive and inductive couplings to the external voltage supply and its ground return, and also in the couplings to the external load, causes the potential of internal supply line 1 and internal ground line 2 to change or "bounce" relative to the external ground. The peak ground bounce voltage subtracts directly from the noise rejection margins of the logic control signal supplied to the circuit, since such signal represents a definite potential with respect to the external ground. Consequently, in extreme cases the ground bounce voltage can effectively cause an input logic "0" control signal to appear to be a "1", and vice versa. This, of course, will result in an incorrect logic value of the output signal produced by the gating circuit. The same problem is also present in ECL and other types of logic gating circuits which have an output stage including a transistor which switches between a high and a low conductive state.

It is known from FIG. 2 of U.S. Pat. No. 4287433 to shunt the base-emitter path of the pull-down transistor Q1 of a TTL gate circuit with the collector-emitter path of a further transistor in series with a resistor, to thereby provide "squaring" of the logic output signal at the collector of transistor Q1. A similar arrangement is shown in U.S. Pat. No. Re. 27,803. However, such patents do not deal with the problem of transient changes in potential of the internal supply and ground lines due to excessive current through the pull-up and pull-down output transistors.

FIG. 2 is a circuit diagram of a typical ECL gate. It includes an output transistor Q5 which has its emitter connected by a resistor 29 to an internal $V_{EE}$ line 2 which is at a negative potential relative to the internal $V_{cc}$ line. The emitter of transistor Q5 drives a load 7 across which the output signal $V_{OUT}$ of the gate circuit is produced. The input logic control signal $V_{IN}$ is applied to the base of an input transistor Q7 the emitter of which is connected in common with the emitter of a control transistor Q9 to a constant current source 25. Such a current source may simply be a resistor of suitable resistance. The collector of transistor Q7 is returned to the internal $V_{cc}$ line 1, and the collector of control transistor Q9 is connected to line 1 by a resistor 30. The base of transistor Q9 is connected to a source of a constant reference volta $V_R$ between the $V_{cc}$ and $V_{EE}$ levels. Transistors Q7 and Q9 thereby form a differential amplifier for the input logic control signal $V_{IN}$, producing an output at the collector of control transistor Q9 which is coupled to the base of output transistor Q5.

When the input logic control signal $V_{IN}$ is a logic "0", transistor Q7 is off and the current from current source 25 all flows through transistor Q9. The collector voltage of transistor Q9 therefore falls, causing the emitter of output transistor Q5 to fall toward the $V_{EE}$ level. A "0" logic signal, at the internal $V_{EE}$ level, is then produced at the emitter of transistor Q5 and so the output signal $V_{OUT}$ of the logic gate is a "0". If the input logic control signal $V_{IN}$ goes high (a logic "1"), transistor Q7 will turn on. That reduces the emitter-collector current of transistor Q9, causing its collector voltage to rise and thereby render output transistor Q5 more conductive. The emitter voltage of transistor Q5 therefore rises, and so the output signal $V_{OUT}$ across external load 7 becomes a logic "1".

SUMMARY OF THE INVENTION

The invention provides a transistor gate circuit in which transient changes in potential of the internal voltage supply lines relative to the external voltage supply to which they are coupled is limited by limiting the maximum current through the output stage of the gate. In the case of an output stage employing a bipolar transistor, such limitation is achieved by making use of the fact that the internal base-emitter resistance thereof causes the base-emitter voltage to increase with increasing collector-emitter current.

Such a gate circuit includes an internal voltage supply line coupled to an external voltage supply, and at least one output stage which produces a logic output signal across a load connected thereto. The output stage may be a composite equivalent transistor formed by a Darlington-connected pair of transistors, the base of such output transistor being coupled to the output of a control transistor which switches the output transistor to a high or a low conductive state depending on the logic value of an input logic control signal supplied to the base of the control transistor. A current bypass transistor is connected with its collector-emitter path in shunt with the base-emitter path of the output transistor, the base of the bypass transistor being coupled to the base of the output transistor. The bypass transistor thereby diverts an increasing proportion of the base current supplied by the control transistor to the output transistor as the collector-emitter current of the output transistor increases, thereby limiting the maximum value of such current and consequently limiting the current in the path from the external voltage supply through the output transistor. The voltage between the internal supply lines and the external voltage supply, due to resistance and inductance of the couplings thereto, is thereby also limited.

In the case of a TTL gate circuit, wherein the aforesaid Darlington-connected pair of transistors serves as a pull-up transistor and there is also a pull-down transistor, another current bypass transistor may be provided with its collector-emitter path in shunt with the base-emitter path of the pull-down transistor so that the maximum collector-emitter current of the pull-down transistor is also limited.

In any type of gate circuit, the current bypass transistor can itself be a composite equivalent transistor formed by a Darlington-connected pair of transistors.

DESCRIPTION OF THE PREFERRED EMBODIMENTS

Figure 1:
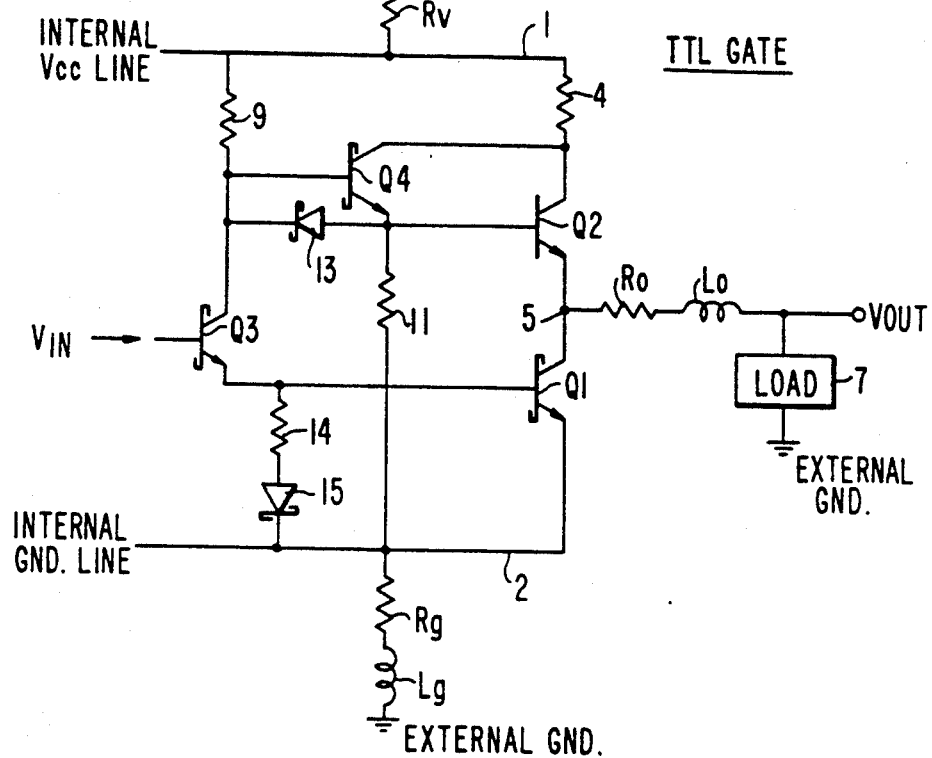
FIG. 1 is a circuit diagram of a typical TTL gate circuit.
Figure 3:
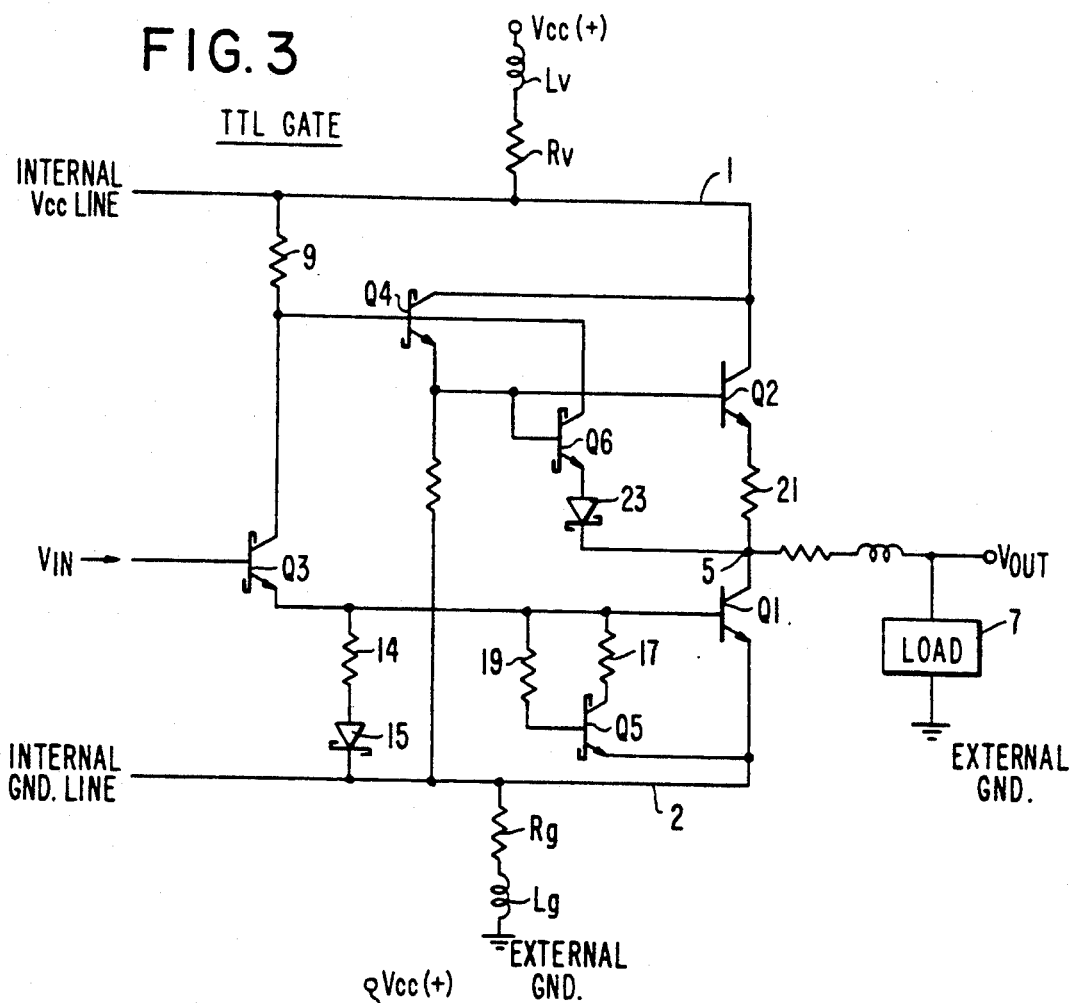
FIG. 3 is a circuit diagram of a TTL gate circuit similar to that in FIG. 1 modified by inclusion of means in accordance with the invention for limiting the current in each of the two output stages of such circuit.

FIG. 3 is a circuit diagram of a TTL logic circuit as in FIG. 1 modified in accordance with the invention to provide current limitation in each of the two output stages thereof, and its basic features and operation are as described above with reference to FIG. 1. Corresponding elements in FIGS. 1 and 3 are similarly identified.

The current limiting arrangement for the pull-down stage comprising transistor Q1 includes a current bypass transistor Q5, the emitter of which is connected to the emitter of transistor Q1 and the collector of which is connected via resistor 17 to the base of transistor Q1. The base of transistor Q5 is connected by a resistor 19 to the base of transistor Q1. Thus, the emitter-collector path of transistor Q5 shunts the emitter-base path of transistor Q1. If the collector-emitter current of transistor Q1 increases, its base voltage will rise due to the internal base-emitter resistance of transistor Q1. Consequently, the base voltage of transistor Q5 will increase, increasing its collector-emitter current. Since that current reduces the base drive current available for transistor Q1, a point will be reached at which a further increase in collector-emitter current of transistor Q1 cannot occur because the requisite base current to support it is diverted through transistor Q5. Thus, a maximum limit is imposed on the collector-emitter current of transistor Q1, such limit being principally determined by the base voltage vs. collector current transfer characteristic of transistor Q5. The limitation on the collector current of transistor Q1 limits the current through the coupling impedance between internal ground line 2 and the external ground, and so imposes a limit on the ground bounce voltage which can occur during switching operation. The resistors 17 and 19 are included to provide some degree of temperature compensation, so that the current limitation established by current bypass transistor Q5 remains substantially constant over a wide range of operating temperatures. They can be omitted if that feature is not required.

The circuit in FIG. 3 also includes a current limiting bypass arrangement for the pull-up output stage comprising the Darlington-connected pair of transistors Q2 and Q4, which are the composite equivalent of a single output transistor of high current gain. The emitter of the second Darlington transistor Q2 is connected by a resistor 21 to junction point 5, to which the collector of transistor Q1 is also connected. A current bypass transistor Q6 has its collector connected to the base of the first Darlington transistor Q4 and its emitter connected by a diode 23 to junction point 5. Thus, the collector-emitter path of transistor Q6 shunts the base-to-emitter path of the composite Darlington transistor formed by transistors Q2 and Q4. The emitter current of transistor Q2 establishes a voltage drop in resistor 21 which serves as a control voltage for transistor Q6, such voltage being proportional to such current. As transistor Q2 becomes increasingly conductive the voltage drop across resistor 21 increases and thereby lowers the voltage at the emitter of transistor Q6. At the same time, the base voltage of transistor Q6 increases due to the increasing base current of transistor Q2 and the internal base-emitter resistance thereof. Consequently, the base drive current and collector-emitter current of transistor Q6 increase, thereby diverting base drive current from transistor Q2. The diode 23 provides a substantially constant bias voltage for the emitter of transistor Q6 relative to junction point 5 and speeds turn-off of transistor Q6 when transistor Q4 turns off. That will occur when the input logic control signal $V_{IN}$ changes to a "1". The collector resistor 4 in FIG. 1 is not required in FIG. 3 because of the limitation on the collector current of transistor Q2.

Because of the high current gain of the Darlington output stage, the resistor 21 and diode 23 are needed to assure that sufficient current will be diverted through bypass transistor Q6. Resistor 21 establishes a substantial base-emitter voltage for transistor Q2, and so also for transistor Q6. The forward voltage drop across diode 23 offsets to some degree the voltage across resistor 21.

In summary, in the logic gate circuit of FIG. 3 the base-emitter paths of the transistors in the pull-up and pull-down output stages are each shunted by a current bypass transistor which diverts an increasing proportion of the base drive current for such stages as the current conducted thereby increases, thereby setting a maximum limit on such current and so also limiting the potential difference or "ground bounce" between the internal ground line of the gate circuit and the terminal of the external power supply to which such line is connected. Such current limitation similarly limits the potential bounce between the internal supply line 1 and the external voltage supply.

Figure 2:
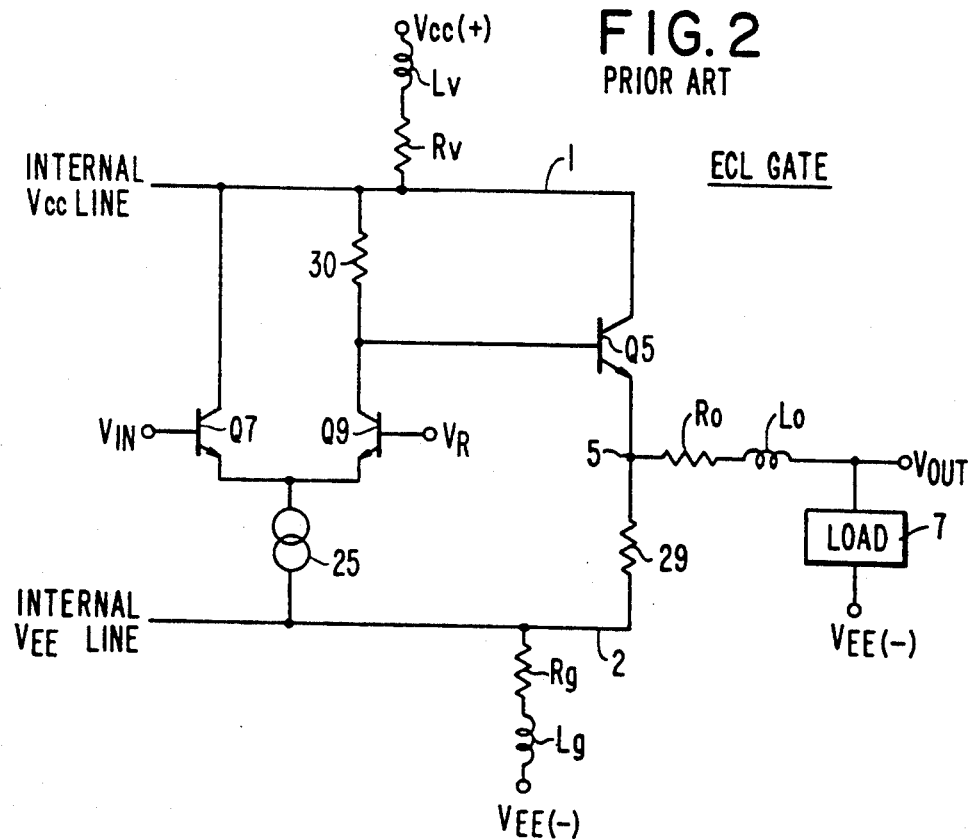
FIG. 2 is a circuit diagram of a typical ECL gate circuit.
Figure 4:
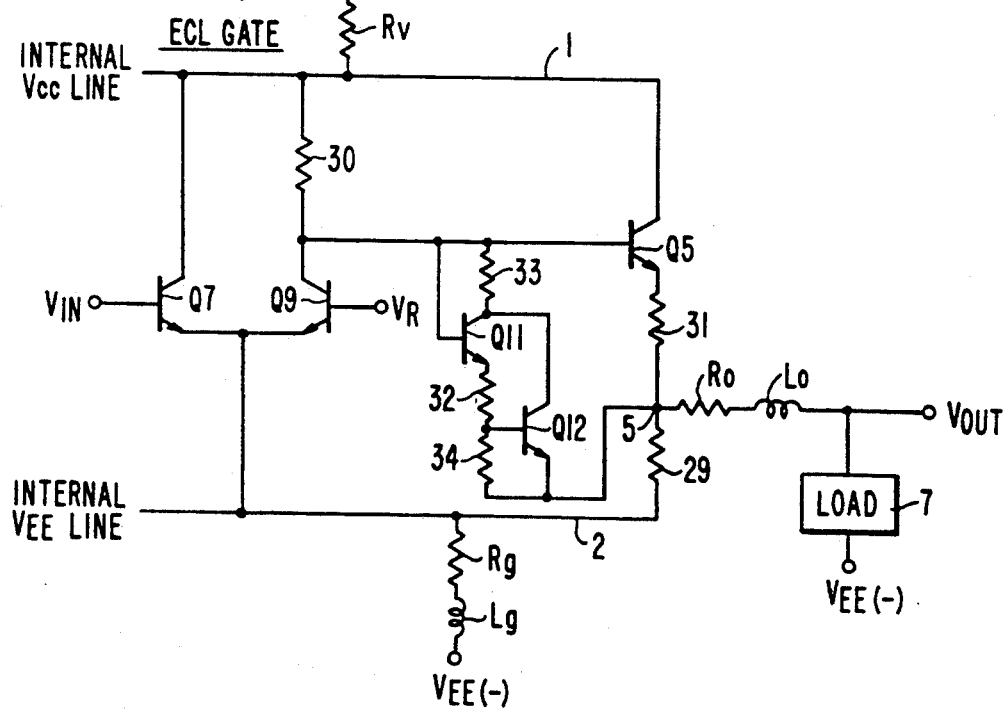
FIG. 4 is a circuit diagram of an ECL gate circuit similar to that in FIG. 2 modified by inclusion of means in accordance with the invention for limiting the current in the single output stage thereof.

FIG. 4 is a circuit diagram of an ECL gate as in FIG. 2 modified so as to incorporate a current limiting arrangement in accordance with the invention. Corresponding elements in FIGS. 2 and 4 have the same identifying numerals.

In FIG. 4 a Darlington-connected pair of transistors Q11 and Q12 constitute a composite current bypass transistor which shunts the base-emitter path of output transistor Q5 of the gate circuit. Specifically, the base of the first Darlington transistor Q11 is connected to the base of output transistor Q5 and the emitter of the second Darlington transistor Q12 is connected to junction point 5 to which the emitter of transistor Q5 is also connected by a resistor 31. The emitter of transistor Q11 is connected to the base of transistor Q12 by a resistor 32, and the collectors thereof are connected in common by a resistor 33 to the base of transistor Q5. The base of transistor Q12 is connected to its emitter by a resistor 34. As the collector-emitter current of transistor Q5 increases its base-emitter voltage will increase and the voltage across resistor 31 will also increase, thereby rendering the Darlington pair Q11 and Q12 increasingly conductive and so diverting an increasing proportion of the base current supplied to transistor Q5 from the collector of transistor Q9. A maximum limit is thereby established for the collector-emitter current of transistor Q5, and so the magnitude of the transient voltage which can be produced due to the resistance and inductance of the couplings to the external $V_{cc}$ supply and the external ground is also limited. The resistor 31 connected between the emitter of output transistor Q5 and junction point 5 serves to establish sufficient base-emitter voltage to allow the Darlington pair Q11 and Q12 to turn on, thereby limiting the base current supplied to transistor Q5.

It will be apparent that although the gate circuits have been shown as employing NPN bipolar transistors, PNP transistors could be substituted simply by reversing the polarity of the supply voltage. In addition, in some applications field effect transistors could be substituted for at least some of the bipolar transistors. These and various other modifications and adaptations of the invention, which will be apparent to those skilled in the art, may be made without departing from the true spirit and scope of the invention as set forth in the ensuing claims.

What is claimed is:

1. In a logic gate circuit having an internal voltage supply line for coupling to an external voltage supply, said gate circuit comprising at least one output transistor and a control transistor having an output coupled to the base of said output transistor to supply base drive current thereto which causes said output transistor to switch between a low and a high conductive state in accordance with a logic control signal supplied to an input of said control transistor; the improvement consisting of a circuit arrangement which limits transient changes in the potential difference between said internal supply line and said external voltage supply during changes of logic state of said gate circuit, said circuit arrangement comprising:

a current bypass transistor having an emitter which is coupled to the emitter of said output transistor and having a collector and a base which are each respectively coupled to the base of said output transistor, at least one of said couplings being a resistive circuit path, so that the collector-emitter path of said bypass transistor shunts the base-emitter path of said output transistor and diverts an increasing proportion of the base drive current supplied to said output transistor as the collector-emitter current of said output transistor increases;

either said output transistor or said bypass transistor being in the form of a Darlington pair including a first and a second transistor, the base of said first transistor being the base of said Darlington pair, the emitter of said second transistor being the emitter of said Darlington pair, and the collectors of said first and second transistors being connected together and constituting the collector of said Darlington pair.

2. A logic gate circuit as claimed in claim 1, wherein said output transistor is said Darlington pair which includes said first and second transistors; the emitter of said Darlington pair is coupled by a resistor to an output terminal of said gate circuit; the output of said control transistor is coupled to the base of said Darlington pair; the emitter of said bypass transistor is coupled to said output terminal and the collector thereof is coupled to the base of said Darlington pair; and the base of aid bypass transistor is coupled to the base of said Darlington pair via the base-emitter path of said first transistor of said Darlington pair.

3. A logic gate circuit as claimed in claim 2, further comprising a diode for coupling the emitter of said bypass transistor to said output terminal of said gate circuit.

4. A logic gate circuit as claimed in claim 1, wherein said bypass transistor is said Darlington pair; the base of said Darlington pair is coupled to the base of said output transistor; the emitter of said Darlington pair is coupled by a first resistor to the emitter of said output transistor; and the collector of said Darlington pair is coupled by a second resistor to the base of said output transistor.

5. In a TTL logic gate circuit having a pair of internal voltage supply lines for connection to an external voltage supply, said gate circuit comprising a pair of output transistors, one for pull-up and the other for pull-down of a logic output signal produced at an output of said gate circuit; the output transistors respectively receiving base drive current from a control transistor which renders one of the output transistors conductive and the other non-conductive in according with the value of a logic control signal supplied to an input of said control transistor; the improvement characterized in that said pull-up output transistor is in the form of a Darlington pair which includes a first and a second transistor, the base of said Darlington pair being the base of said first transistor, and in that said gate circuit further comprises:

a current bypass transistor having an emitter which is coupled to the emitter of said Darlington pair, a collector which is coupled to the base of said Darlington pair, and a base which is coupled to the emitter of said first transistor of said Darlington pair; so that the collector-emitter path of said bypass transistor shunts the base-emitter path of said Darlington pair and diverts an increasing proportion of the base drive current supplied thereto by said control transistor as the collector-emitter current of said Darlington pair increases, thereby limiting such collector-emitter current;

the collector-emitter current of said Darlington pair producing a potential difference of said internal voltage supply lines relative to said external voltage supply due to resistance and inductance of the connections to such voltage supply, so that said limitation of the collector-emitter current of said Darlington pair limits said potential difference.

6. In an ECL logic gate circuit having a pair of internal voltage supply lines for connection to an external voltage supply, said gate circuit comprising an output transistor receiving base drive current from a control transistor which render said output transistor conductive to an extent determined by the value of a logic control signal supplied to an input of said control transistor; the improvement characterized in that said gate circuit further comprises:

a current bypass transistor in the form of a Darlington pair which includes a first and a second transistor, the base of said first transistor being the base of said Darlington pair, the emitter of said second transistor being the emitter of said Darlington pair, and the collectors of said first and second transistors being connected together and constituting the collector of said Darlington pair;

the emitter of said Darlington pair being coupled by a resistor to the emitter of said output transistor, the base of said Darlington pair being connected to the base of said output transistor, and the collector of said Darlington pair being coupled by a resistor to the base of said output transistor; so that the collector-emitter path of said Darlington pair shunts the base-emitter path of said output transistor and diverts an increasing proportion of the base drive current supplied thereto as the collector-emitter current of said output transistor increases, thereby limiting the collector-emitter current of said output transistor and consequently also limiting the voltage produced by such current in the connections between the internal voltage supply lines and said external voltage supply.

* * * * *